(12) United States Patent
Saini et al.

(10) Patent No.: US 11,609,356 B2
(45) Date of Patent: Mar. 21, 2023

(54) SATURATION MODELLING OF A RESERVOIR

(71) Applicant: Baker Hughes Oilfield Operations LLC, Houston, TX (US)

(72) Inventors: Prem Saini, Voorburg (NL); Marco van der Linden, Leiden (NL)

(73) Assignee: Baker Hughes Oilfield Operations LLC, Houston, TX (US)

(*) Notice: Subject to any disclaimer, the term of this patent is extended or adjusted under 35 U.S.C. 154(b) by 410 days.

(21) Appl. No.: 16/889,717

(22) Filed: Jun. 1, 2020

(65) Prior Publication Data

US 2020/0386908 A1 Dec. 10, 2020

Related U.S. Application Data

(60) Provisional application No. 62/857,596, filed on Jun. 5, 2019.

(51) Int. Cl.
| | |
|---|---|
| *G01V 99/00* | (2009.01) |
| *G06F 30/20* | (2020.01) |
| *E21B 49/00* | (2006.01) |
| *G06F 30/28* | (2020.01) |

(52) U.S. Cl.
CPC .......... *G01V 99/005* (2013.01); *E21B 49/00* (2013.01); *G06F 30/20* (2020.01); *E21B 2200/20* (2020.05); *G06F 30/28* (2020.01)

(58) Field of Classification Search
CPC ....... G01V 99/005; G06F 30/20; G06F 30/28; E21B 49/00; E21B 2200/20

USPC .......................................................... 703/10
See application file for complete search history.

(56) References Cited

U.S. PATENT DOCUMENTS 10,151,855 B2 * 12/2018 Dogru ..................... G06F 30/20
10,400,590 B1 * 9/2019 Aldred ..................... E21B 49/00

OTHER PUBLICATIONS

Adams, Stephen J. "Which saturation-height function?." SPWLA 57th Annual Logging Symposium. OnePetro, 2016. pp. 1-7. (Year: 2016).*

* cited by examiner

*Primary Examiner* — John E Johansen
(74) *Attorney, Agent, or Firm* — Mintz Levin Cohn Ferris Glovsky and Popeo, PC (57) ABSTRACT

A three-dimensional grid of a hydrocarbon reservoir can be received. The three-dimensional grid can include a plurality of cells, each cell of the plurality of cells can include a first index value, a second index value, and a third index value. The first index value, the second index value, and the third index value of each cell can together uniquely identify each cell of the plurality of cells. Each cell can further include at least one parameter measured from the hydrocarbon reservoir. A hydrocarbon saturation distribution of the hydrocarbon reservoir can be determined using a saturation height function and the at least one parameter of each cell of the plurality of cells. The hydrocarbon saturation distribution can include a cell hydrocarbon saturation estimate for each cell of the plurality of cells. The hydrocarbon saturation distribution can be provided. Related apparatus, systems, techniques and articles are also described.

15 Claims, 10 Drawing Sheets

SATURATION MODELLING OF A RESERVOIR

RELATED APPLICATION

This application claims priority under 35 U.S.C. § 119(e) to U.S. Provisional Application No. 62/857,596 filed Jun. 5, 2019, the entire contents of which are hereby expressly incorporated by reference herein.

BACKGROUND

Hydrocarbon in place refers to the total hydrocarbon content of a hydrocarbon reservoir. But hydrocarbon in place cannot be measured directly and has to be estimated from other parameters measured prior to drilling or after production has begun. For example, the hydrocarbon reservoir can be modeled using a three-dimensional (3D) grid and the 3D grid can be used to estimate the hydrocarbon in place volume. But in some cases, the estimates of the hydrocarbon in place volume can be inaccurate.

SUMMARY

In an aspect, a three-dimensional grid of a hydrocarbon reservoir can be received. The three-dimensional grid can include a plurality of cells, each cell of the plurality of cells can include a first index value, a second index value, and a third index value. The first index value, the second index value, and the third index value of each cell can together uniquely identify each cell of the plurality of cells. Each cell can further include at least one parameter measured from the hydrocarbon reservoir. A hydrocarbon saturation distribution of the hydrocarbon reservoir can be determined using a saturation height function and the at least one parameter of each cell of the plurality of cells. The hydrocarbon saturation distribution can include a cell hydrocarbon saturation estimate for each cell of the plurality of cells. The hydrocarbon saturation distribution can be provided.

One or more of the following features can be included in any feasible combination. The at least one parameter can include a first depth of the cell and a second depth of the cell different from the first depth. A first hydrocarbon saturation estimate can be determined using the first depth of the cell. A second hydrocarbon saturation estimate can be determined using the second depth of the cell. The first hydrocarbon saturation estimate and the second hydrocarbon saturation estimate can be weighted by at least one of height and volume. In response to a difference between the weighted first hydrocarbon saturation estimate and the weighted second hydrocarbon saturation estimate being less than a predetermined value, the weighted first hydrocarbon saturation estimate and the weighted second hydrocarbon saturation estimate can be combined into a cell hydrocarbon saturation estimate. The cell hydrocarbon saturation estimate can include an average of the weighted first hydrocarbon saturation estimate and the weighted second hydrocarbon saturation estimate.

In response to a difference between the first hydrocarbon saturation estimate and the second hydrocarbon saturation estimate being greater than or equal to a predetermined value and until a difference between a weighted third hydrocarbon saturation estimate and a weighted fourth hydrocarbon saturation estimate is less than a predetermined value and a difference between a weighted fifth hydrocarbon saturation estimate and a weighted sixth hydrocarbon saturation estimate is less than the predetermined value, the cell can be sliced into a first slice and a second slice. The first slice can include a third depth of the cell and a fourth depth of the cell different from the third depth. The second slice can include a fifth depth of the cell and a sixth depth of the cell different from the fifth depth. A third hydrocarbon saturation estimate can be determined using the third depth. A fourth hydrocarbon saturation estimate can be determined using the fourth depth. A fifth hydrocarbon saturation estimate can be determined using the fifth depth. A sixth hydrocarbon saturation estimate can be determined using the sixth depth. The third hydrocarbon saturation estimate, the fourth hydrocarbon saturation estimate, the fifth hydrocarbon saturation estimate, and the sixth hydrocarbon saturation estimate can be weighted by at least one of height and volume.

In response to the difference between the weighted third hydrocarbon saturation estimate and the weighted fourth hydrocarbon saturation estimate being less than the predetermined value, the weighted third hydrocarbon saturation estimate and the weighted fourth hydrocarbon saturation estimate can be combined into a first slice hydrocarbon saturation estimate. In response to the difference between the fifth hydrocarbon saturation estimate and the sixth hydrocarbon saturation estimate being less than the predetermined value, the weighted fifth hydrocarbon saturation estimate and the weighted sixth hydrocarbon saturation estimate can be combined into a second slice hydrocarbon saturation estimate. In response to a difference between the first slice hydrocarbon saturation estimate and the second slice hydrocarbon saturation estimate being less than the predetermined value, the first slice hydrocarbon saturation estimate and the second slice hydrocarbon saturation estimate can be combined into the cell hydrocarbon saturation estimate. The cell hydrocarbon saturation estimate can include an average of the first slice hydrocarbon saturation estimate and the second slice hydrocarbon saturation estimate.

The cell can be sliced into a first slice and a second slice. The first slice can include a first volume and the second slice can include a second volume. The first volume can be equal to the second volume. A first hydrocarbon saturation estimate can be determined using the first volume of the cell. A second hydrocarbon saturation estimate can be determined using the second volume of the cell. The first hydrocarbon saturation estimate and the second hydrocarbon saturation estimate can be weighted by at least one of height and volume.

In response to a difference between the weighted first hydrocarbon saturation estimate and the weighted second hydrocarbon saturation estimate being less than a predetermined value: the weighted first hydrocarbon saturation estimate and the weighted second hydrocarbon saturation estimate can be combined into a cell hydrocarbon saturation estimate. The cell hydrocarbon saturation estimate can include an average of the weighted first hydrocarbon saturation estimate and the weighted second hydrocarbon saturation estimate. Otherwise, in response to the difference between the weighted first hydrocarbon saturation estimate and the weighted second hydrocarbon saturation estimate being greater than or equal to the predetermined value: the first slice can be sliced into a third slice and a fourth slice. The third slice can include a third volume and the fourth slice can include a fourth volume. The third volume can be equal to the fourth volume. The second slice can be sliced into a fifth slice and a sixth slice. The fifth slice can include a fifth volume and the sixth slice can include a sixth volume. The fifth volume can be equal to the fourth volume. A third hydrocarbon saturation estimate can be determined using the third volume, a fourth hydrocarbon saturation estimate can be determined using the fourth volume, a fifth hydrocarbon saturation estimate can be determined using the fifth volume, and a sixth hydrocarbon saturation estimate can be determined using the sixth volume. The third hydrocarbon saturation estimate, the fourth hydrocarbon saturation estimate, the fifth hydrocarbon saturation estimate, and the sixth hydrocarbon saturation estimate can be weighted by at least one of height and volume.

The at least one parameter can further include at least one of a permeability, a porosity, a water saturation, a surface tension, a capillary pressure, and/or a contact angle. The hydrocarbon saturation distribution can be provided in a graphical user interface display space. Each cell of the plurality of cells can be visually represented using a color of a plurality of colors, the color of the plurality of colors corresponding to the cell hydrocarbon saturation estimate of the cell. The saturation height function can include at least one of a Thomeer function, a Lambda function, a Brooks-Corey function, and a Leverett-J function. A well construction plan can be determined for the hydrocarbon reservoir using the hydrocarbon saturation distribution. The providing can include at least one of transmitting and persisting the hydrocarbon saturation distribution.

Non-transitory computer program products (i.e., physically embodied computer program products) are also described that store instructions, which when executed by one or more data processors of one or more computing systems, causes at least one data processor to perform operations herein. Similarly, computer systems are also described that may include one or more data processors and memory coupled to the one or more data processors. The memory may temporarily or permanently store instructions that cause at least one processor to perform one or more of the operations described herein. In addition, methods can be implemented by one or more data processors either within a single computing system or distributed among two or more computing systems. Such computing systems can be connected and can exchange data and/or commands or other instructions or the like via one or more connections, including a connection over a network (e.g. the Internet, a wireless wide area network, a local area network, a wide area network, a wired network, or the like), via a direct connection between one or more of the multiple computing systems, etc.

The details of one or more variations of the subject matter described herein are set forth in the accompanying drawings and the description below. Other features and advantages of the subject matter described herein will be apparent from the description and drawings, and from the claims.

DESCRIPTION OF DRAWINGS

Like reference symbols in the various drawings indicate like elements.

DETAILED DESCRIPTION

Oil and gas operations can include estimating hydrocarbon in place volumes of a reservoir. In some cases, hydrocarbon in place of a reservoir can be estimated using saturation calculation methods on a three-dimensional (3D) grid model of the reservoir. But in complex reservoir settings, such as fault intersections, stacked reservoirs, and/or the like, the hydrocarbon saturations can estimated for each cell of the 3D grid using saturation height functions. In such cases, the hydrocarbon in place volume can be estimated by averaging the hydrocarbon saturation obtained for each cell. But the hydrocarbon saturation estimates obtained for each cell can be inaccurate. For example, around the fluid contacts, in the transition zone, and/or where area versus depth varies within the 3D grid cell, hydrocarbon saturation estimates can be inaccurate. And using inaccurate hydrocarbon saturation estimates can lead to inaccurate estimates of hydrocarbon in place volumes, poor reservoir well construction decisions, and inefficient field development.

Some implementations of the current subject matter can provide a hydrocarbon saturation distribution of the 3D reservoir grid. The hydrocarbon saturation distribution can include a hydrocarbon saturation estimate for each cell of the plurality of cells in the 3D reservoir grid. Estimating the hydrocarbon saturation of a cell can include, for example, using a saturation height function to determine two hydrocarbon saturation estimates, one for the top-most point in the cell and one for the bottom-most point in the cell. The two hydrocarbon saturation estimates can be weighted by height, volume, and/or the like. Once the two hydrocarbon saturation estimates are weighted, the difference between them (e.g., discretization error) can be determined. When the difference between the weighted hydrocarbon saturation estimates is below a predetermined value, the weighted hydrocarbon saturation estimates can be averaged and provided as the cell hydrocarbon saturation estimate.

When the difference between the weighted hydrocarbon saturation estimates is at or above a predetermined value, the cell can be sliced and the two hydrocarbon saturation estimates described above can be determined for each slice of the cell. Each slice of the cell can be further sliced until the discretization error for a respective slice is below the predetermined value. When the discretization error for all slices of the cell are below the predetermined value, the hydrocarbon saturation estimate of the cell can include the average of the weighted hydrocarbon saturations of all of the slices in the cell. By reducing the discretization error of the hydrocarbon saturation estimates below the predetermined value, hydrocarbon in place volumes of a reservoir can be estimated with greater accuracy, better reservoir construction investment decisions can be made, and more efficient field development can be achieved.

Figure 1:
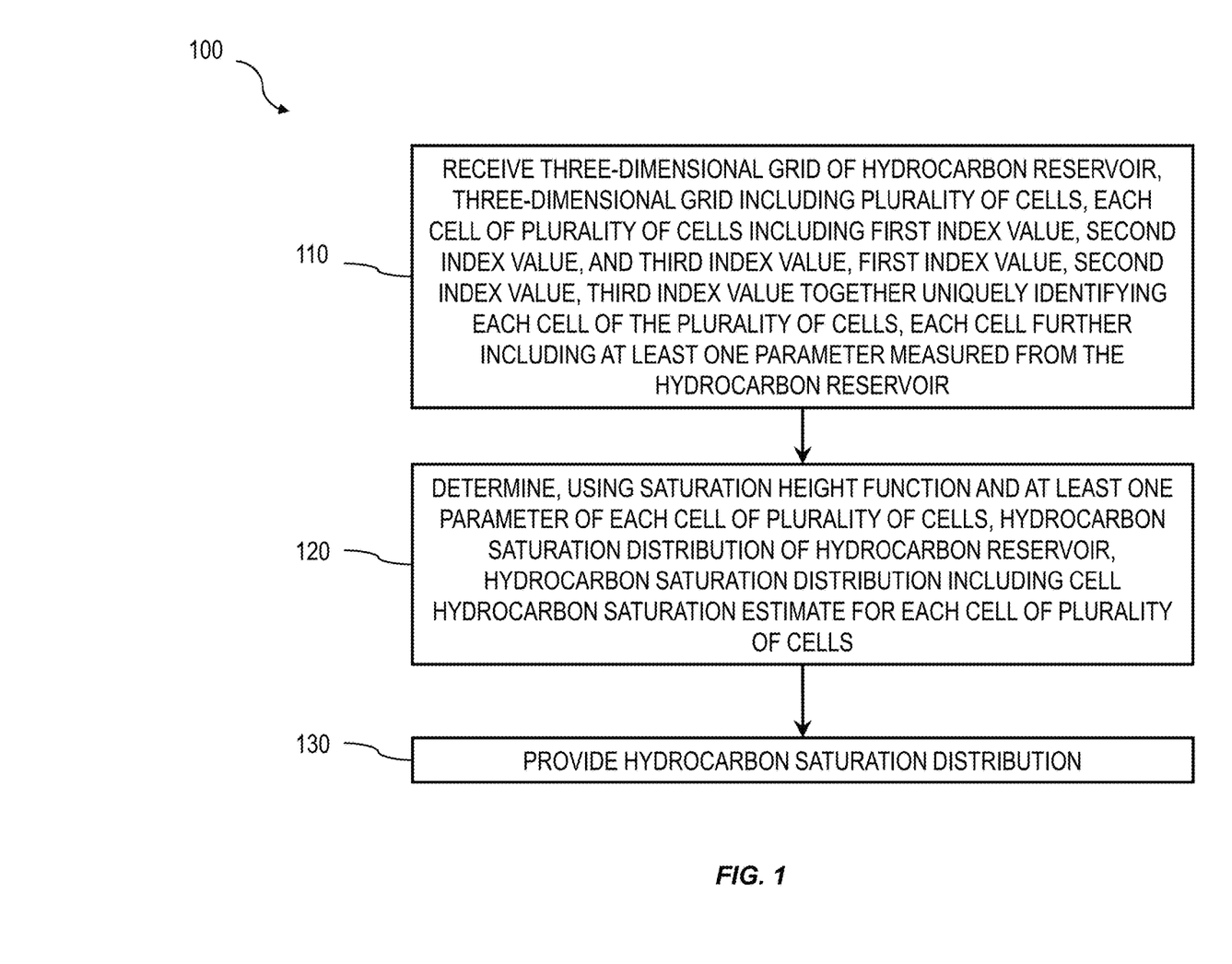
FIG. 1 is a process flow diagram illustrating an example hydrocarbon saturation distribution estimation.

FIG. 1 is a process flow diagram 100 illustrating an example process of hydrocarbon saturation distribution estimation. By reducing discretization error in the estimation of hydrocarbon distribution to below a predetermined value, hydrocarbon in place volumes of a reservoir can be estimated with greater accuracy, better reservoir construction investment decisions can be made, and more efficient field development can be achieved.

At 110, a three-dimensional (3D) grid of a hydrocarbon reservoir can be received. The 3D grid of the hydrocarbon reservoir can include a plurality of cells. Each cell can include a first index value, a second index value, and a third index value. For example, the first index value can correspond to a first dimension, the second index value can correspond to a second dimension, and the third index value can correspond to a third dimension. Together, for example, the first index value, the second index value, and the third index value of a given cell can uniquely identify the given cell. For example, $c_1=(1, 2, 3)$ can uniquely identify a cell $c_1$ with a first index value of 1, a second index value of 2, and a third index value of 3. As will be discussed later, hydrocarbon saturation estimates can be determined for each cell $c_1$ in the 3D grid and a respective hydrocarbon saturation estimate of a cell $c_1$ can be associated with the respective cell.

Each cell can include at least one parameter measured from the hydrocarbon reservoir. For example, the at least one parameter can include a depth of the center of the cell, a top depth of the cell, bottom depth of the cell, a porosity value, a permeability value, a surface tension value, a capillary pressure, a contact angle, and/or the like. As will be discussed below, the at least one parameter of a cell can be used to determine a hydrocarbon saturation estimate for the cell. The parameters measured from the hydrocarbon reservoir can be received from, for example, a database containing the parameters, a logging while drilling log, surface sensors, downhole sensors, and/or the like.

At 120, a hydrocarbon saturation distribution of the hydrocarbon reservoir can be determined. The hydrocarbon saturation distribution can include a hydrocarbon saturation estimate for each cell of the plurality of cells in the 3D grid. The hydrocarbon saturation estimate for a cell of the plurality of cells can be determined using a saturation height function and at least one parameter of the cell. For example, a parameter of the cell can include a first depth of the cell (e.g., a depth of the top-most portion of the cell), a second depth of the cell (e.g., a depth of the bottom-most portion of the cell), and/or the like.

A saturation height function can be used, for example, to predict saturation in a reservoir for a given depth above the free water level. The saturation height function can include, for example, a Thomeer function, a Lambda function, a Brooks-Corey function, a Leverett-J function, and/or the like. For example, the Leverett-J function can be defined as $$J(S_w) = \frac{P_c}{\sigma \cos\theta} \frac{\sqrt{K}}{\varphi},$$

where $S_w$ is the water saturation at a given height, measured as a fraction, $P_c$ is the capillary pressure, $\sigma$ is surface tension, $\theta$ is the contact angle, K is the permeability, and $\varphi$ is the porosity.

Using the saturation height function, a first hydrocarbon saturation estimate can be determined at the first depth of the cell and a second hydrocarbon saturation estimate can be determined at the second depth of the cell. The first hydrocarbon saturation estimate and the second hydrocarbon saturation estimate can be weighted, for example, by height, volume, and/or the like. A difference between the weighted first hydrocarbon estimate and the weighted second hydrocarbon estimate (e.g., discretization error) can be calculated.

In response to the difference between the weighted first hydrocarbon saturation estimate and the weighted second hydrocarbon saturation estimate being less than a predetermined value (e.g., 0.05, and/or the like), the weighted first hydrocarbon saturation estimate and the weighted second hydrocarbon saturation estimate can be combined into the hydrocarbon saturation estimate of the respective cell. For example, the weighted first hydrocarbon saturation estimate and the weighted second hydrocarbon saturation estimate can be averaged. If, however, the difference between the weighted first hydrocarbon saturation estimate and the weighted second hydrocarbon saturation estimate is greater than or equal to the predetermined value, the cell can be sliced (e.g., partitioned) into slices. For example, the cell can be sliced into two halves horizontally about the depth of the center of the cell. The cells can be divided in this way until the difference between the weighted hydrocarbon saturation at the top depth of the slice (e.g., a third depth of the slice, a fifth depth of the slice, and/or the like) and the weighted hydrocarbon saturation at the bottom depth of the slice (e.g., a fourth depth of the slice, a sixth depth of the slice, and/or the like) is less than the predetermined value (e.g., slicing continues until, for a given slice, the discretization error is less than the predetermined value).

In response to the difference between the weighted hydrocarbon saturation at the top depth of the slice and the weighted hydrocarbon saturation at the bottom depth of the slice being less than the predetermined value, the weighted hydrocarbon saturation at the top depth of the slice and the weighted hydrocarbon saturation at the bottom depth of the slice can be combined into a hydrocarbon saturation estimate of the slice. For example, the weighted hydrocarbon saturation at the top depth of the slice and the weighted hydrocarbon saturation at the bottom depth of the slice can be averaged. The combined hydrocarbon saturation estimates of each slice in a cell can be combined to form the cell hydrocarbon saturation estimate. Collectively, the cell hydrocarbon saturation estimate of each cell in the 3D grid form the hydrocarbon saturation distribution.

For example, if a 3D grid G includes eight cells $c_1=(1,1,1)$, $c_2=(2, 1,1)$, $c_3=(1,2,1)$, $c_4=(2,2,1)$, $c_5=(1,1,2)$, $c_6=(2,1,2)$, $c_7=(1,2,2)$, $c_8=(2,2,2)$, such that $G=\{c_1, \ldots, c_8\}$, and each cell: $i=1, \ldots, 8$, has a cell hydrocarbon saturation $h_i$: $i=1, \ldots, 8$, then the hydrocarbon saturation distribution can include a map of cells to hydrocarbon saturation estimates. For example, the hydrocarbon saturation distribution can include $D=\{c_i:h_i|i=1, \ldots, 8\}$.

At 130, the hydrocarbon saturation distribution can be provided. For example, the hydrocarbon saturation distribution can be provided in a display space of a graphical user interface. For example, each cell $c_i \in G$ can be visually represented on the display space of the graphical user interface by a color of a plurality of colors. The color can be selected based on the value of the hydrocarbon saturation estimate $h_i$ of cell $c_1$. For example, a color map can define hydrocarbon saturation estimate value intervals corresponding to each color in the plurality of colors. In a simplified example, the color map CM={[0.3, 0.4]: "red", [[0.4, 0.5]: "yellow", . . . , [0.9, 1.0]:"blue"}. Based on the color map, each cell $c_i$ in the 3D grid G can be represented by the color corresponding to the interval the hydrocarbon saturation estimate value $h_i$ of cell $c_i$ falls in. For example, if $h_i$=0.94, then the cell $c_i$ will be represented by "blue". In some implementations, the hydrocarbon saturation distribution can be transmitted to, for example, a remote computing device, a local computing device, and/or the like. In some implementations, the hydrocarbon saturation distribution can be persisted, for example, to a solid state drive, hard disk drive, and/or the like. In some implementations, a well construction plan can be determined for the hydrocarbon reservoir using the hydrocarbon saturation distribution of the hydrocarbon reservoir. The well construction plan can be provided, for example, by displaying it in the display space of the graphical user interface, transmitting it over a network, persisting it in storage, and/or the like.

Figure 2:
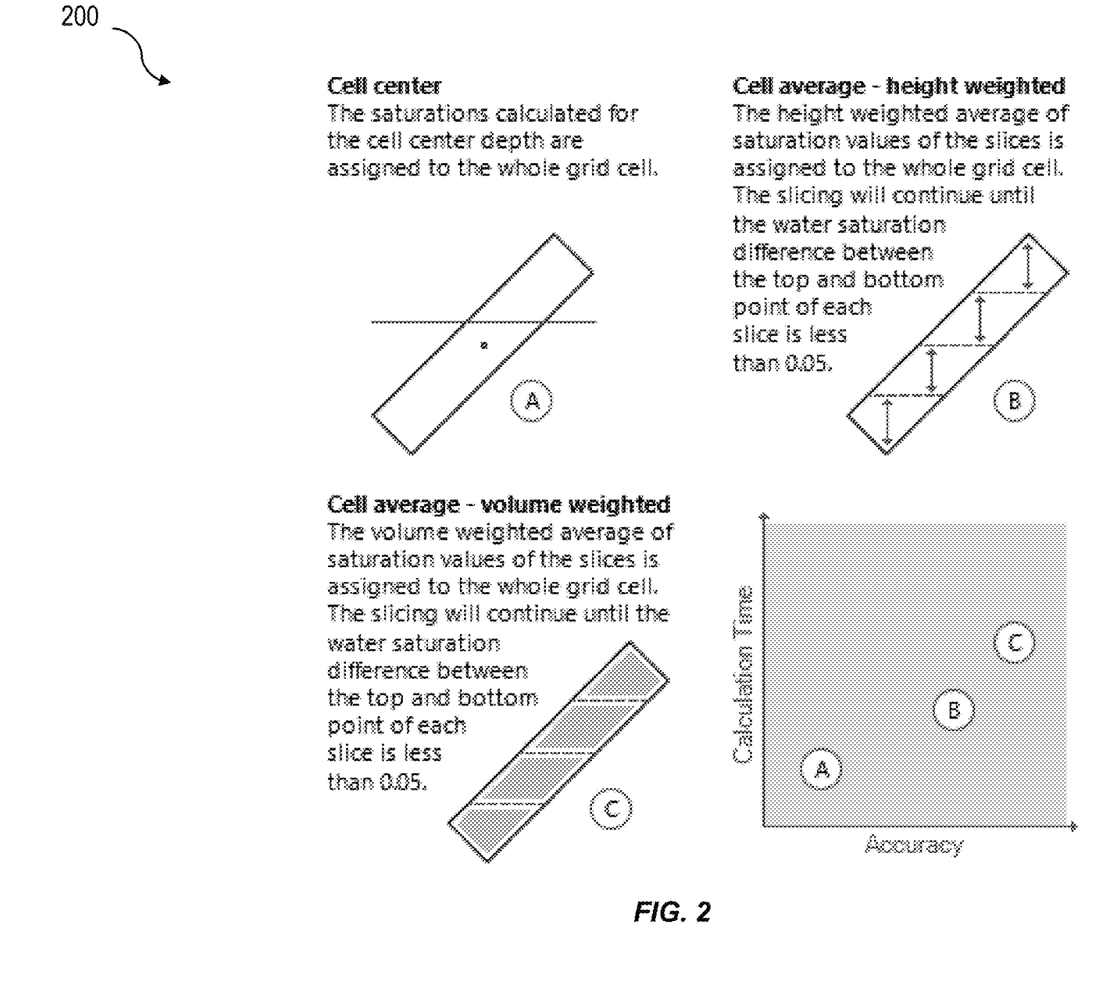
FIG. 2 is a diagram illustrating an example averaging weighted hydrocarbon saturation in a cell of a three-dimensional grid of a hydrocarbon reservoir.

FIG. 2 is a diagram 200 illustrating averaging weighted hydrocarbon saturation in a cell of a three-dimensional grid of a hydrocarbon reservoir. By reducing discretization error in the estimation of hydrocarbon distribution to below a predetermined value, hydrocarbon in place volumes of a reservoir can be estimated with greater accuracy, better reservoir construction investment decisions can be made, and more efficient field development can be achieved.

In some implementations, as shown by encircled letter "A" in FIG. 2, a hydrocarbon saturation can be calculated for the cell center depth and the cell center hydrocarbon saturation can be assigned as the cell hydrocarbon saturation estimate. In some implementations, as shown by encircled letter "B" in FIG. 2, the hydrocarbon saturation of slices in a cell can be averaged by height. The height weighted average of hydrocarbon saturation values of the slices in the cell can be assigned as the cell hydrocarbon saturation estimate. In the illustrated example, the cell can continuously be sliced until the difference between the water saturation at the top point and the bottom point of each slice is less than 0.05. In some implementations, as shown by encircled letter "C" in FIG. 2, the hydrocarbon saturation of slices in a cell can be averaged by volume. The volume weighted average of hydrocarbon saturation values of the slices in the cell can be assigned as the cell hydrocarbon saturation estimate. In the illustrated example, the cell will be continuously sliced until the difference between the water saturation at the top point and the bottom point of each slice is less than 0.05. As illustrated in the plot of accuracy vs. calculation time, implementations associated with calculation C can be the most accurate without much loss in calculation time as compared to implementations associated with calculations A and B, whereas implementations associated with calculation A can be significantly less accurate without much saving in calculation time when compared to implementations associated with calculations B and C.

Figure 3:
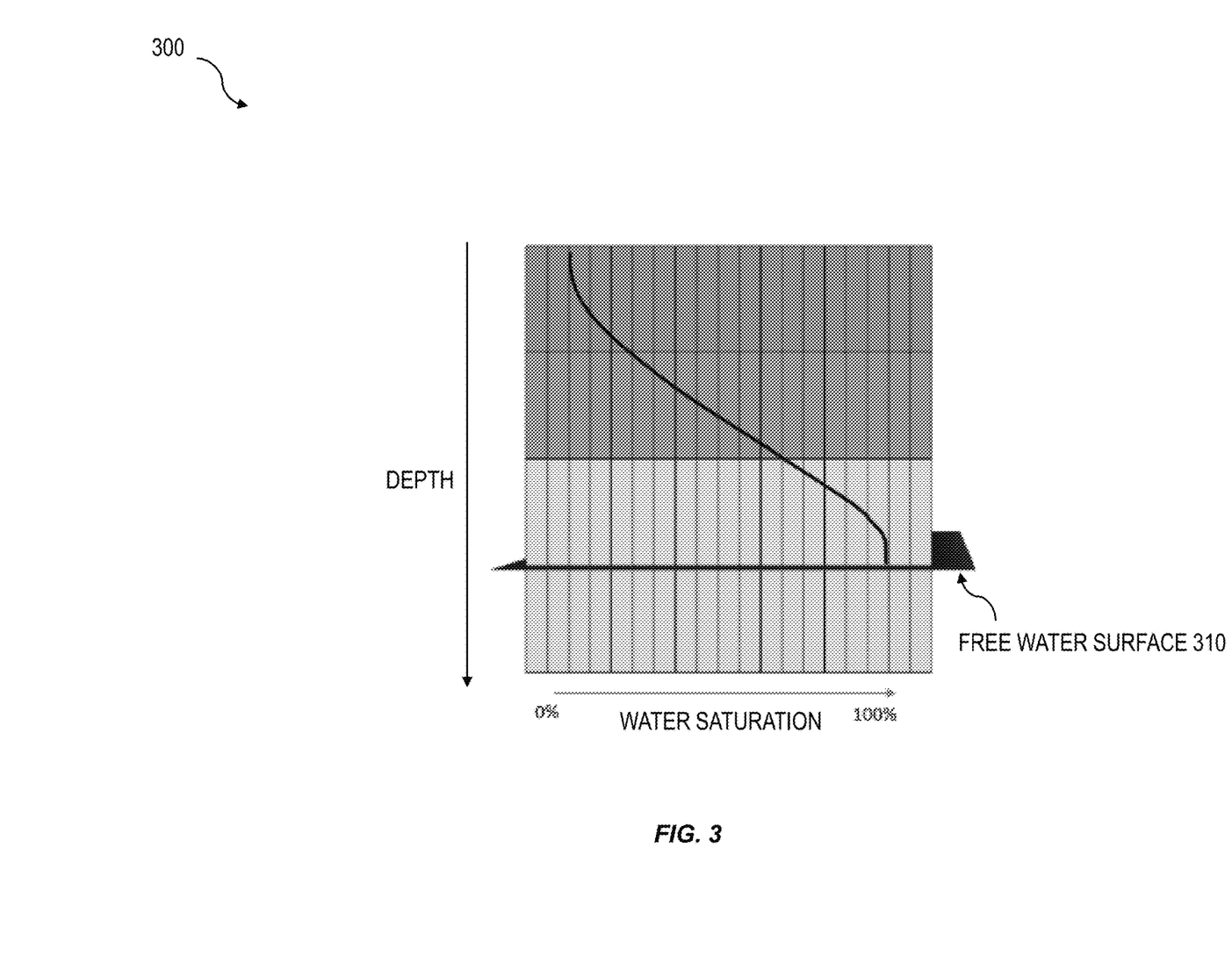
FIG. 3 is a diagram illustrating an example transition zone in a saturation height function.

FIG. 3 is a diagram 300 illustrating a saturation height function in a transition zone. By reducing discretization error in the estimation of hydrocarbon distribution to below a predetermined value, including in transition zones, hydrocarbon in place volumes of a reservoir can be estimated with greater accuracy, better reservoir construction investment decisions can be made, and more efficient field development can be achieved. In some cases, the transition zone effects can occur over only a few cells closer to the free water level 310 in a 3D grid 300 and therefore the discretization effects can be large. This can be overcome by, for example, accurately integrating the saturation-height effects, even within a cell. As illustrated in the diagram, hydrocarbon saturation decreases and water saturation increases non-linearly with depth as the free water line 310 is approached from above. As a result, applying some implementations of the current subject matter can result in substantially no grid discretization effects (e.g., discretization errors, and/or the like), making some implementations of the current subject matter more suitable for uncertainty analysis as the response to variation in height-above contact and can be robust and smooth.

Figure 4:
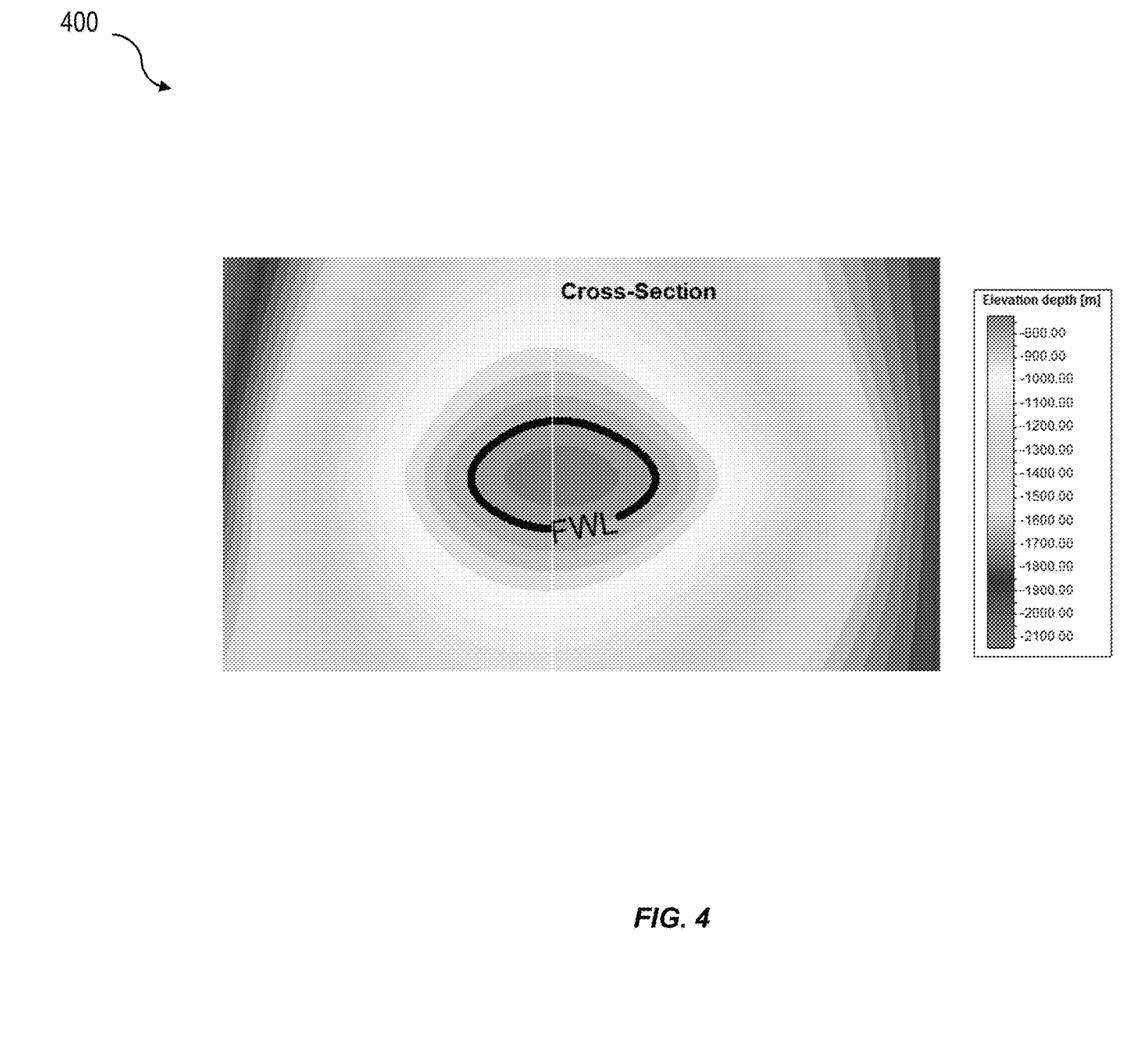
FIG. 4 is a diagram illustrating an example 4-way dip closure reservoir model.
Figure 5:
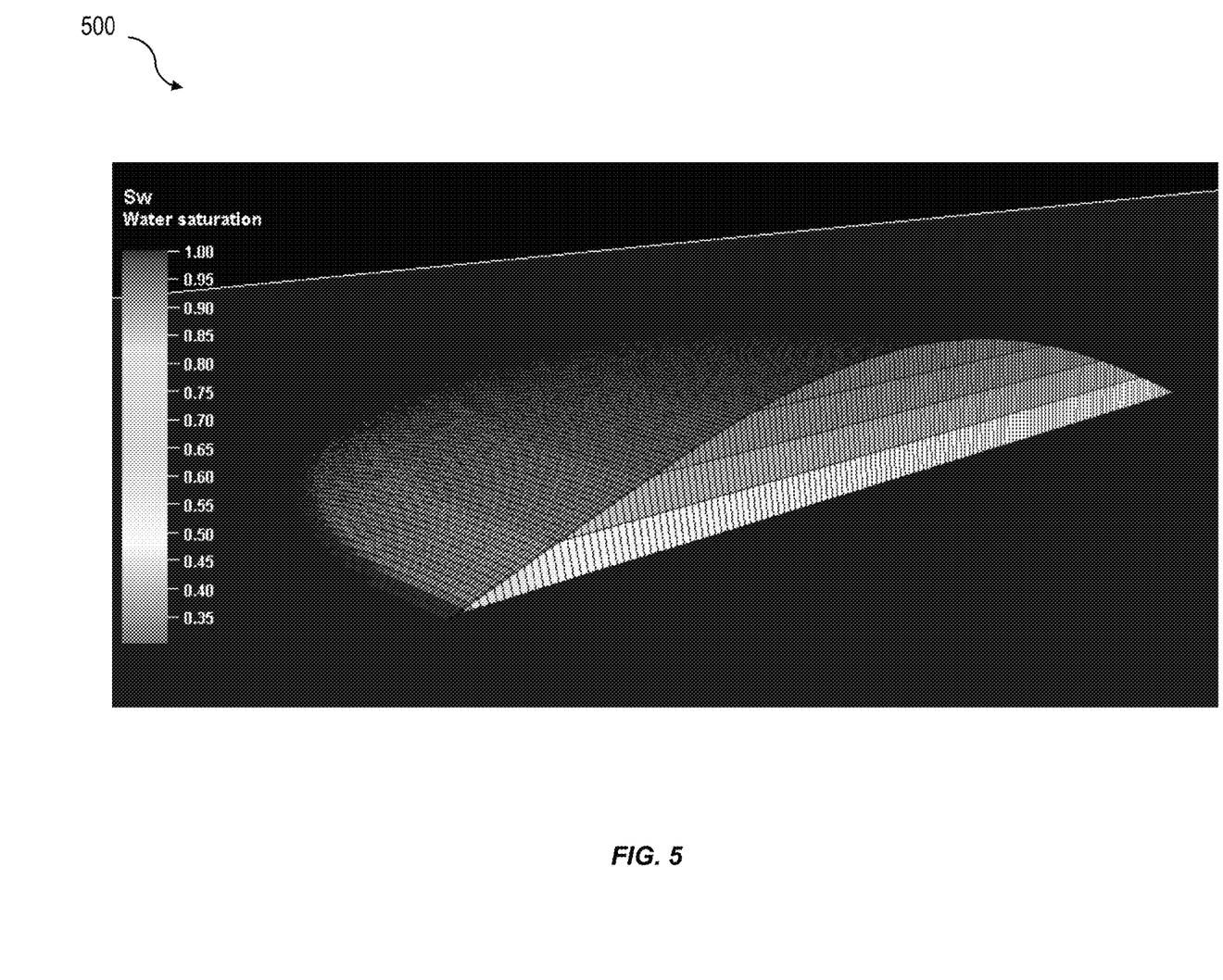
FIG. 5 is a diagram illustrating example water saturation values and hydrocarbon volumes in different layers of a three-dimensional grid.
Figure 6:
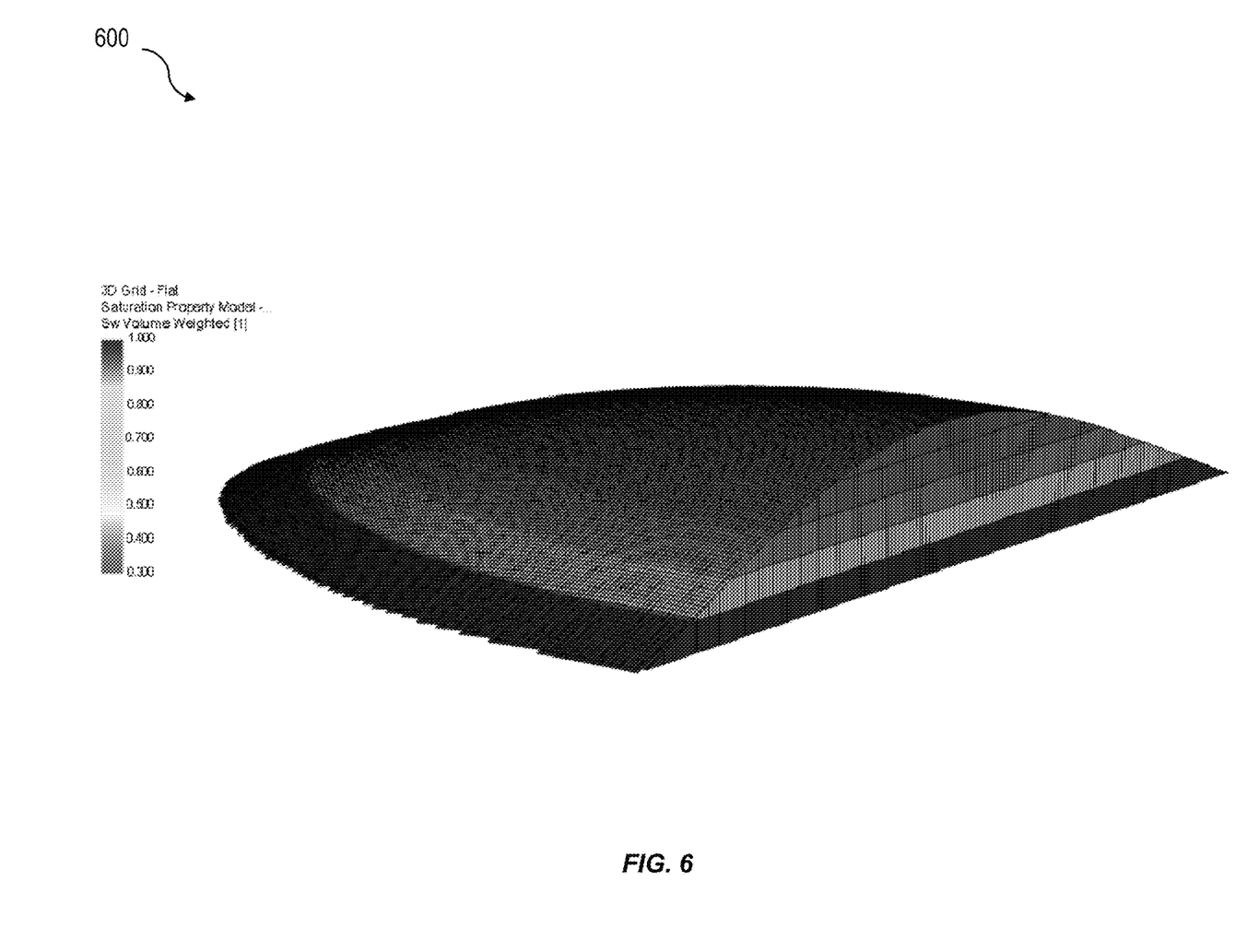
FIG. 6 is a diagram illustrating example water saturation values and hydrocarbon volumes in different layers of a three-dimensional grid.

FIG. 4 is a diagram 400 illustrating a cross-section of a 4-way dip closure reservoir model, for example, of a carbonate reservoir in the middle east. Diagram 400 can be used to, for example, illustrate the accuracy of the volume weighted saturation averaging method in comparison with a more simplistic saturation averaging method. For example, FIG. 5 is a diagram 500 illustrating water saturation values and hydrocarbon volumes in different layers of a three-dimensional grid using a simplistic saturation averaging method on a 3D grid of the reservoir model illustrated in 400 and FIG. 6 is a diagram 600 illustrating water saturation values and hydrocarbon volumes in different layers of a three-dimensional grid using the volume weighted saturation averaging method on a 3D grid of the reservoir model illustrated in 400. The saturation averaging method illustrated in diagram 500 can produce a bulk volume of 10812.0 and hydrocarbon pore volume of 619.0 and the volume weighted saturation averaging method illustrated in diagram 600 can produce a bulk volume of 10798.3 and a hydrocarbon pore volume of 589.25. The difference in produced hydrocarbon pore volume can be 5% (e.g., the volume weighted saturation averaging method can be 5% more accurate), and in some cases, such as changing the orientation of the 3D grid, larger differences (e.g., 5%-10% difference) can be calculated.

Figure 7:
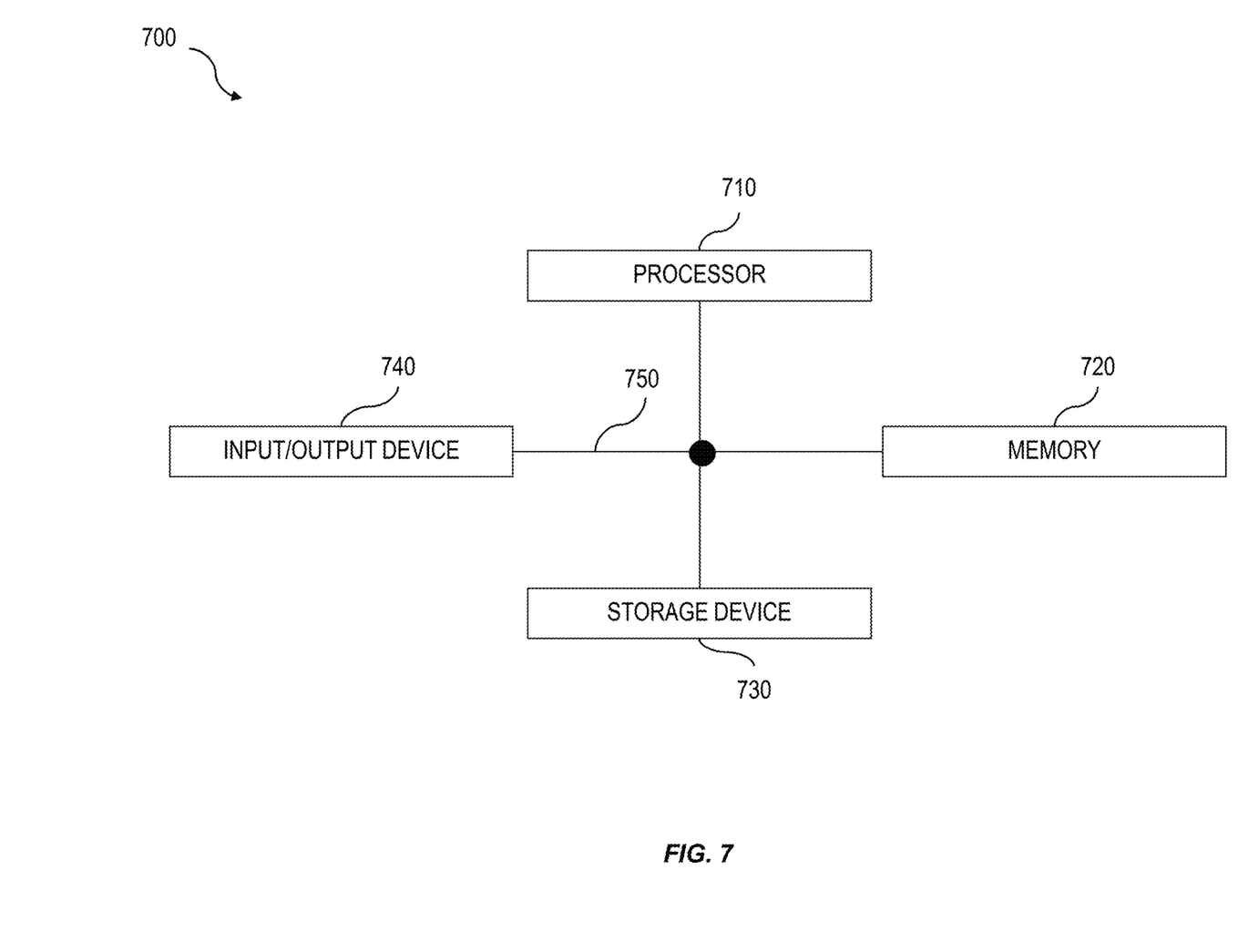
FIG. 7 is a system block diagram illustrating an example computing system.

In some implementations, the current subject matter can be configured to be implemented in a system 700, as shown in FIG. 7. The system 700 can include one or more of a data processor, such as processor 710, a memory 720, a storage device 730, and an input/output device 740. Each of the components 710, 720, 730 and 740 can be interconnected using a system bus 750. The processor 710 can be configured to process instructions for execution within computing system. In some implementations, the processor 710 can be a single-threaded processor. In alternate implementations, the processor 710 can be a multi-threaded processor. The processor 710 can be further configured to process instructions stored in the memory 720 or on the storage device 730, including receiving or sending information through the input/output device 740. The memory 720 can store information within the system 700. In some implementations, the memory 720 can be a computer-readable medium. In alternate implementations, the memory 720 can be a volatile memory unit. In yet some implementations, the memory 720 can be a non-volatile memory unit. The storage device 730 can be capable of providing mass storage for the system 700. In some implementations, the storage device 730 can be a computer-readable medium. In alternate implementations, the storage device 730 can be a floppy disk device, a hard disk device, an optical disk device, a tape device, non-volatile solid state memory, or any other type of storage device. The input/output device 740 can be configured to provide input/output operations for the system 700. In some implementations, the input/output device 740 can include a keyboard and/or pointing device. In alternate implementations, the input/output device 740 can include a display unit for displaying graphical user interfaces.

Figure 8:
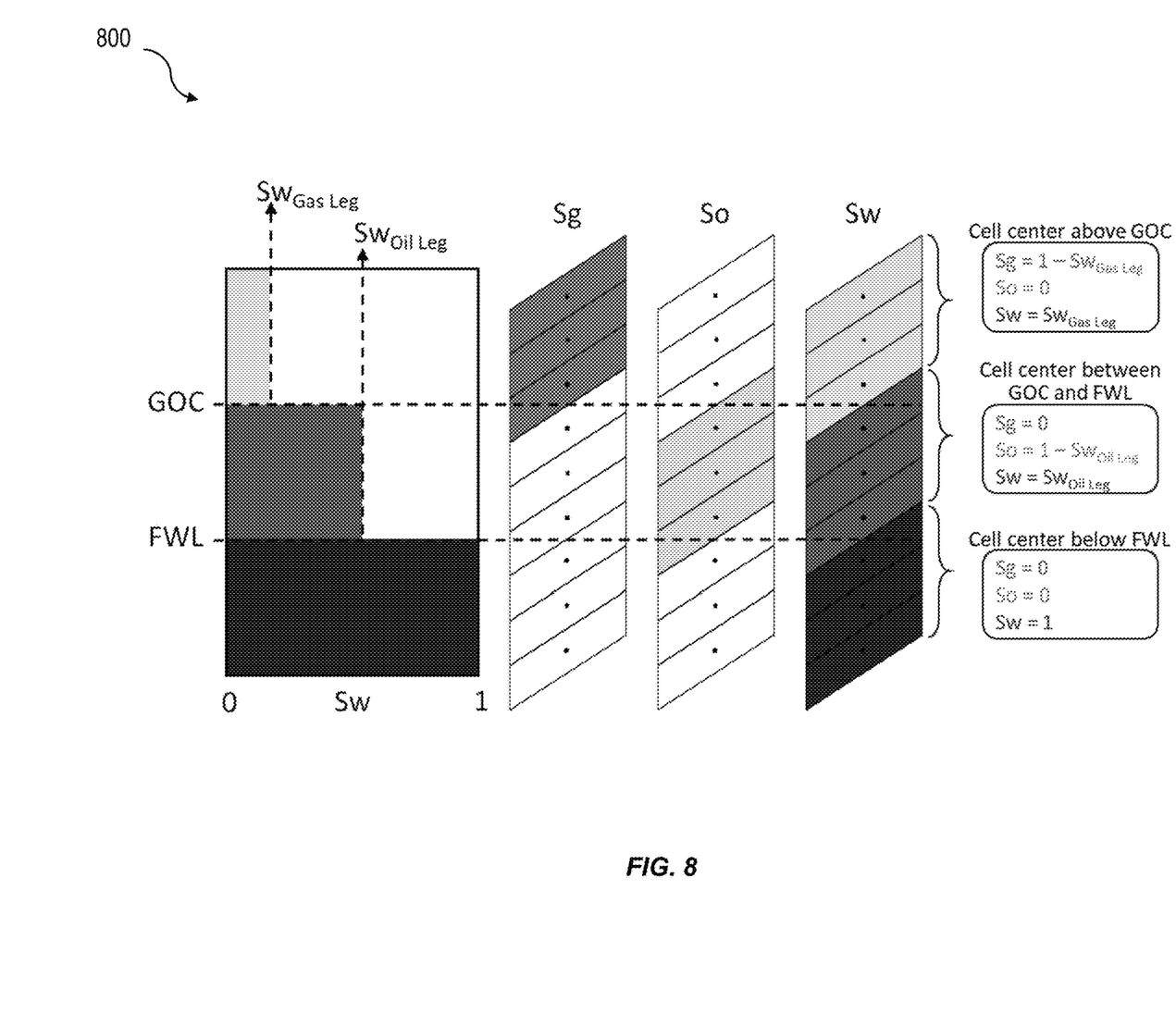
FIG. 8 is a diagram illustrating an example of the cell center process.
Figure 9:
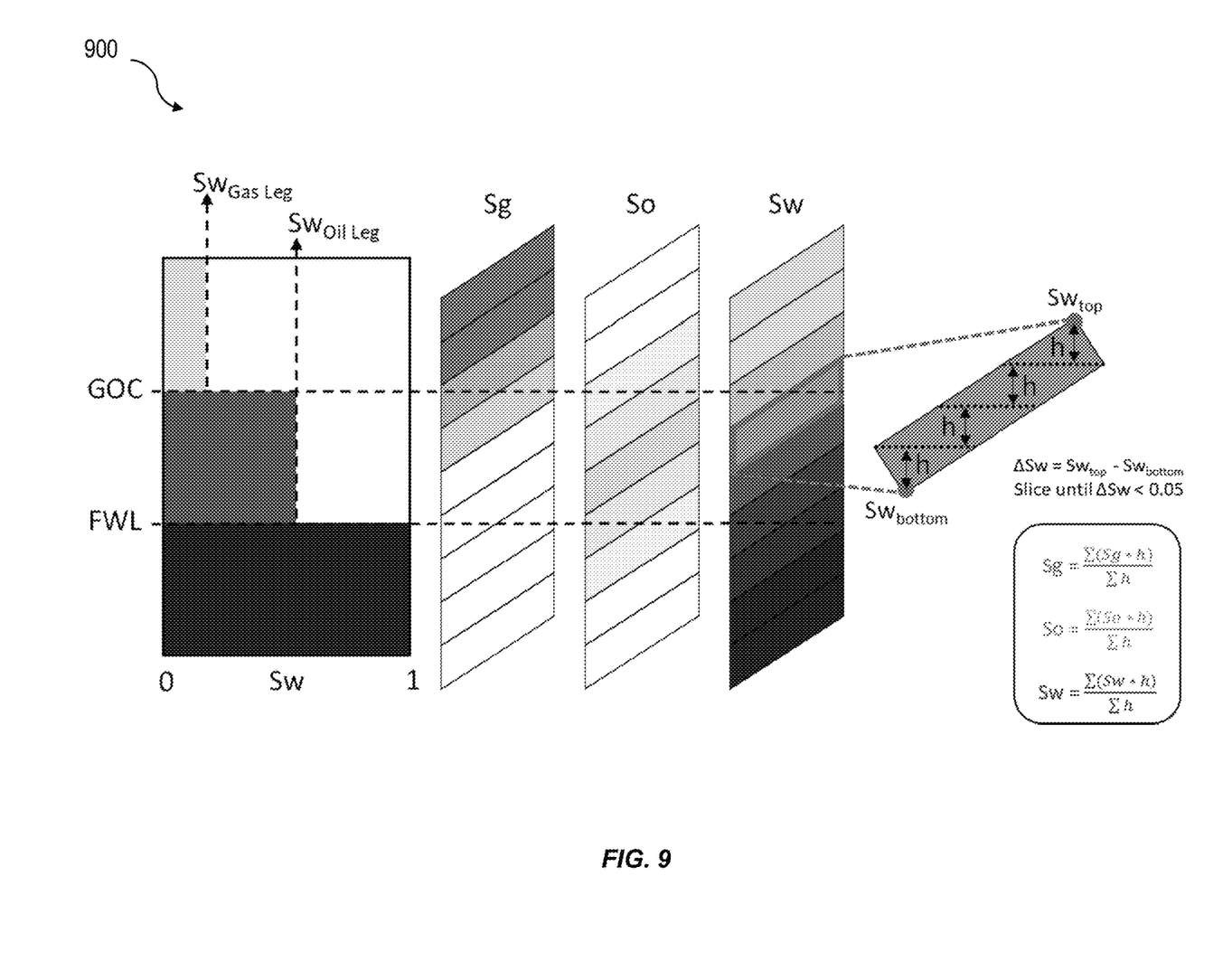
FIG. 9 is a diagram illustrating an example of the cell average-height weighted process.
Figure 10:
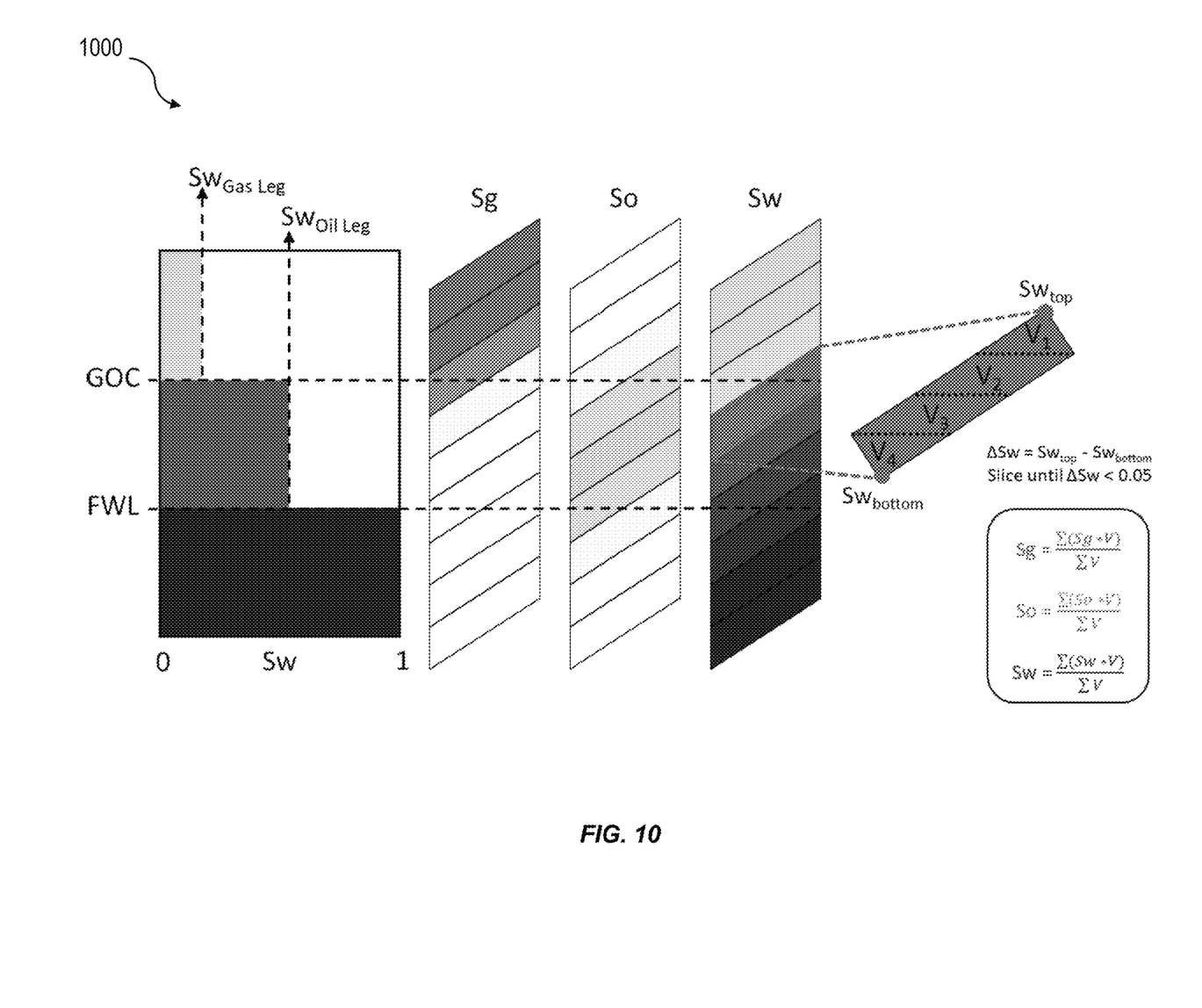
FIG. 10 is a diagram illustrating an example of the cell average-volume weighted process.

Although a few variations have been described in detail above, other modifications or additions are possible. For example, as illustrated in FIG. 8, in the cell center method, the saturation values (e.g., $S_g$, $S_o$, $S_w$) can be calculated at the cell center depth and can be assigned to the whole grid cell. The saturation values can depend on the location of the cell center. As illustrated in FIG. 9, in the height weighted cell average method, the water saturation values (e.g., $S_w$) can be calculated for the top-most and the bottom-most points of each grid cell (e.g., $S_{wtop}$, $S_{wbottom}$). The difference between the $S_{wtop}$ and $S_{wbottom}$ can be calculated (e.g., $\Delta S_w$). The cells can be sliced horizontally until the $\Delta S_w$ for each slice is smaller than a predetermined value, such as 5%. The height weighted average of saturation values of the slices can be assigned to the whole grid cell. The cell geometry can be simplified into an area vs. depth assumption, for example, for a box with one-way dip. As illustrated in FIG. 10, in the volume weighted cell average method, the water saturation values (e.g., $S_w$) can be calculated for the topmost and the bottommost points of each grid cell (e.g., $S_{wtop}$, $S_{wbottom}$) The difference between the $S_{wtop}$ and $S_{wbottom}$ can be calculated (e.g., $\Delta S_w$). The cells can be sliced horizontally until the $\Delta S_w$ for each slice is smaller than a predetermined value, such as 5%. The volume weighted average of saturation values of the slices can be assigned to the whole grid cell. Each slice can get a volume from the full cell geometry, including, for example, faulted and eroded cell effects.

The subject matter described herein provides many technical advantages. For example, the discretization error of the hydrocarbon saturation estimates can be reduced below a predetermined value, hydrocarbon in place volumes and hydrocarbon in place volume distribution in the 3D grid (e.g., model) of a reservoir can be estimated with greater accuracy. And optimal well completion, favorable enhanced oil recovery, better reservoir construction investment decisions can be made, and more efficient field development can be achieved.

One or more aspects or features of the subject matter described herein can be realized in digital electronic circuitry, integrated circuitry, specially designed application specific integrated circuits (ASICs), field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device. The programmable system or computing system may include clients and servers. A client and server are generally remote from each other and typically interact through a communication network. The relationship of client and server arises by virtue of computer programs running on the respective computers and having a client-server relationship to each other.

These computer programs, which can also be referred to as programs, software, software applications, applications, components, or code, include machine instructions for a programmable processor, and can be implemented in a high-level procedural language, an object-oriented programming language, a functional programming language, a logical programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as would a non-transient solid-state memory or a magnetic hard drive or any equivalent storage medium. The machine-readable medium can alternatively or additionally store such machine instructions in a transient manner, such as for example as would a processor cache or other random access memory associated with one or more physical processor cores.

To provide for interaction with a user, one or more aspects or features of the subject matter described herein can be implemented on a computer having a display device, such as for example a cathode ray tube (CRT) or a liquid crystal display (LCD) or a light emitting diode (LED) monitor for displaying information to the user and a keyboard and a pointing device, such as for example a mouse or a trackball, by which the user may provide input to the computer. Other kinds of devices can be used to provide for interaction with a user as well. For example, feedback provided to the user can be any form of sensory feedback, such as for example visual feedback, auditory feedback, or tactile feedback; and input from the user may be received in any form, including acoustic, speech, or tactile input. Other possible input devices include touch screens or other touch-sensitive devices such as single or multi-point resistive or capacitive trackpads, voice recognition hardware and software, optical scanners, optical pointers, digital image capture devices and associated interpretation software, and the like.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it is used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." In addition, use of the term "based on," above and in the claims is intended to mean, "based at least in part on," such that an unrecited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. A method comprising:
receiving, by at least one data processor of a computing device, a three-dimensional grid of a hydrocarbon reservoir, the three-dimensional grid including a plurality of cells, each cell of the plurality of cells including a first index value corresponding to a first dimension of a respective cell in the three-dimensional grid, a second index value corresponding to a second dimension of a respective cell in the three-dimensional grid, and a third index value corresponding to a third dimension of a respective cell in the three-dimensional grid, the first index value, the second index value, and the third index value together uniquely identifying each cell of the plurality of cells, each cell further including at least one parameter measured from the hydrocarbon reservoir;
determining, by the at least one data processor, a hydrocarbon saturation distribution of the hydrocarbon reservoir, the hydrocarbon saturation distribution including a cell hydrocarbon saturation estimate for each cell of the plurality of cells and having a reduced discretization error, wherein the determining further comprises applying a saturation height function and the at least one parameter of each cell of the plurality of cells;
slicing each cell into a first slice and a second slice, the first slice including a first volume and the second slice including a second volume, the first volume equal to the second volume;
determining a first hydrocarbon saturation estimate using the first volume of each cell;
determining a second hydrocarbon saturation estimate using the second volume of each cell; and
weighting the first hydrocarbon saturation estimate and the second hydrocarbon saturation estimate by at least one of height and volume to reduce discretization error;
determining, by the at least one data processor, using the hydrocarbon saturation distribution, a well construction plan for the hydrocarbon reservoir; and
providing, by the at least one data processor, the well construction plan in a graphical user interface display space of the computing device, transmitting it over a network, and/or persisting it in a storage of the computing device.

2. The method of claim 1, wherein the at least one parameter includes a first depth of the cell and a second depth of the cell different from the first depth and wherein the determining further comprises:
determining a first hydrocarbon saturation estimate using the first depth of the cell;
determining a second hydrocarbon saturation estimate using the second depth of the cell; and
weighting the first hydrocarbon saturation estimate and the second hydrocarbon saturation estimate by at least one of height and volume.

3. The method of claim 2, wherein responsive to a difference between the weighted first hydrocarbon saturation estimate and the weighted second hydrocarbon saturation estimate being less than a predetermined value, the method further comprises:
combining the weighted first hydrocarbon saturation estimate and the weighted second hydrocarbon saturation estimate into a cell hydrocarbon saturation estimate, wherein the cell hydrocarbon saturation estimate includes an average of the weighted first hydrocarbon saturation estimate and the weighted second hydrocarbon saturation estimate.

4. The method of claim 2, wherein responsive to a difference between the first hydrocarbon saturation estimate and the second hydrocarbon saturation estimate being greater than or equal to a predetermined value and until a difference between a weighted third hydrocarbon saturation estimate and a weighted fourth hydrocarbon saturation estimate is less than a predetermined value and a difference between a weighted fifth hydrocarbon saturation estimate and a weighted sixth hydrocarbon saturation estimate is less than the predetermined value, the method further comprises:
slicing the cell into a first slice and a second slice, the first slice including a third depth of the cell and a fourth depth of the cell different from the third depth, the second slice including a fifth depth of the cell and a sixth depth of the cell different from the fifth depth;
determining a third hydrocarbon saturation estimate using the third depth, a fourth hydrocarbon saturation estimate using the fourth depth, a fifth hydrocarbon saturation estimate using the fifth depth, and a sixth hydrocarbon saturation estimate using the sixth depth; and
weighting the third hydrocarbon saturation estimate, the fourth hydrocarbon saturation estimate, the fifth hydrocarbon saturation estimate, and the sixth hydrocarbon saturation estimate by at least one of height and volume.

5. The method of claim 4, further comprising:
combining, in response to the difference between the weighted third hydrocarbon saturation estimate and the weighted fourth hydrocarbon saturation estimate being less than the predetermined value, the weighted third hydrocarbon saturation estimate and the weighted fourth hydrocarbon saturation estimate into a first slice hydrocarbon saturation estimate;
combining, in response to the difference between the fifth hydrocarbon saturation estimate and the sixth hydrocarbon saturation estimate being less than the predetermined value, the weighted fifth hydrocarbon saturation estimate and the weighted sixth hydrocarbon saturation estimate into a second slice hydrocarbon saturation estimate; and
combining, in response to a difference between the first slice hydrocarbon saturation estimate and the second slice hydrocarbon saturation estimate being less than the predetermined value, the first slice hydrocarbon saturation estimate and the second slice hydrocarbon saturation estimate into the cell hydrocarbon saturation estimate, wherein the cell hydrocarbon saturation estimate includes an average of the first slice hydrocarbon saturation estimate and the second slice hydrocarbon saturation estimate.

6. The method of claim 1, further comprising:
responsive to a difference between the weighted first hydrocarbon saturation estimate and the weighted second hydrocarbon saturation estimate being less than a predetermined value, combining the weighted first hydrocarbon saturation estimate and the weighted second hydrocarbon saturation estimate into a cell hydrocarbon saturation estimate, wherein the cell hydrocarbon saturation estimate includes an average of the weighted first hydrocarbon saturation estimate and the weighted second hydrocarbon saturation estimate; and
responsive to the difference between the weighted first hydrocarbon saturation estimate and the weighted second hydrocarbon saturation estimate being greater than or equal to the predetermined value, the method further comprises:
slicing the first slice into a third slice and a fourth slice, the third slice including a third volume and the fourth slice including a fourth volume, the third volume equal to the fourth volume,
slicing the second slice into a fifth slice and a sixth slice, the fifth slice including a fifth volume and the sixth slice including a sixth volume, the fifth volume equal to the fourth volume,
determining a third hydrocarbon saturation estimate using the third volume, a fourth hydrocarbon saturation estimate using the fourth volume, a fifth hydrocarbon saturation estimate using the fifth volume, and a sixth hydrocarbon saturation estimate using the sixth volume, and
weighting the third hydrocarbon saturation estimate, the fourth hydrocarbon saturation estimate, the fifth hydrocarbon saturation estimate, and the sixth hydrocarbon saturation estimate by at least one of height and volume.

7. The method of claim 1, wherein the at least one parameter further includes at least one of a permeability, a porosity, a water saturation, a surface tension, a capillary pressure, and a contact angle.

8. The method of claim 1, wherein the well construction plan is displayed with each cell of the plurality of cells being visually represented using a color of a plurality of colors, the color of the plurality of colors corresponding to the cell hydrocarbon saturation estimate of the cell.

9. The method of claim 1, wherein the saturation height function includes at least one of a Thomeer function, a Lambda function, a Brooks-Corey function, and a Leverett-J function.

10. A system comprising:
a computing device;
at least one data processor within the computing device; and
a memory storing computer-executable instructions which, when executed by the at least one data processor, cause the at least one data processor to perform operations comprising:
receiving a three-dimensional grid of a hydrocarbon reservoir, the three-dimensional grid including a plurality of cells, each cell of the plurality of cells including a first index value corresponding to a first dimension of a respective cell in the three-dimensional grid, a second index value corresponding to a second dimension of a respective cell in the three-dimensional grid, and a third index value corresponding to a third dimension of a respective cell in the three-dimensional grid, the first index value, the second index value, and the third index value together uniquely identifying each cell of the plurality of cells, each cell further including at least one parameter measured from the hydrocarbon reservoir;
determining, using a saturation height function and the at least one parameter of each cell of the plurality of cells, a hydrocarbon saturation distribution of the hydrocarbon reservoir, the hydrocarbon saturation distribution including a cell hydrocarbon saturation estimate for each cell of the plurality of cells and having a reduced discretization error, wherein the determining further includes:
determining a first hydrocarbon saturation estimate using the first depth of the cell;
determining a second hydrocarbon saturation estimate using the second depth of the cell;
weighting the first hydrocarbon saturation estimate and the second hydrocarbon saturation estimate by at least one of height and volume to reduce discretization error;
determining, using the hydrocarbon saturation distribution, a well construction plan for the hydrocarbon reservoir; and
providing, the well construction plan to a graphical user interface display space of a computing device, transmitting it over a network, and/or persisting it in a storage of the computing device.

11. The system of claim 10, wherein, responsive to a difference between the weighted first hydrocarbon saturation estimate and the weighted second hydrocarbon saturation estimate being less than a predetermined value, the instructions are further configured to cause the at least one data processor to perform operations including
combining the weighted first hydrocarbon saturation estimate and the weighted second hydrocarbon saturation estimate into a cell hydrocarbon saturation estimate, wherein the cell hydrocarbon saturation estimate includes an average of the weighted first hydrocarbon saturation estimate and the weighted second hydrocarbon saturation estimate.

12. The system of claim 10, wherein the at least one parameter further includes at least one of a permeability, a porosity, a water saturation, a surface tension, a capillary pressure, and a contact angle.

13. The system of claim 10, wherein the well construction plan is displayed within each cell of the plurality of cells being visually represented using a color of a plurality of colors, the color of the plurality of colors corresponding to the cell hydrocarbon saturation estimate of the cell.

14. The system of claim 10, wherein the saturation height function includes at least one of a Thomeer function, a Lambda function, a Brooks-Corey function, and a Leverett-J function.

15. A non-transitory machine readable storage medium containing program instructions, which when executed by a data processor cause the data processor to perform operations including
receiving a three-dimensional grid of a hydrocarbon reservoir, the three-dimensional grid including a plurality of cells, each cell of the plurality of cells including a first index value corresponding to a first dimension of a respective cell in the three-dimensional grid, a second index value corresponding to a second dimension of a respective cell in the three-dimensional grid, and a third index value corresponding to a third dimension of a respective cell in the three-dimensional grid, the first index value, the second index value, and the third index value together uniquely identifying each cell of the plurality of cells, each cell further including at least one parameter measured from the hydrocarbon reservoir;
determining, using a saturation height function and the at least one parameter of each cell of the plurality of cells, a hydrocarbon saturation distribution of the hydrocarbon reservoir, the hydrocarbon saturation distribution including a cell hydrocarbon saturation estimate for each cell of the plurality of cells and having a reduced discretization error, wherein the determining further includes determining a first hydrocarbon saturation estimate using the first depth of the cell, determining a second hydrocarbon saturation estimate using the second depth of the cell, and weighting the first hydrocarbon saturation estimate and the second hydrocarbon saturation estimate by at least one of height and volume to reduce discretization error;

determining, using the hydrocarbon saturation distribution, a well construction plan for the hydrocarbon reservoir; and providing, the well construction plan to a graphical user interface display space of a computing device, transmitting it over a network, and/or persisting it in a storage of the computing device.

* * * * *